(12) United States Patent
Wu

(10) Patent No.: US 6,563,751 B1
(45) Date of Patent: May 13, 2003

(54) SYSTEM AND METHOD FOR TESTING TDM SRAMS

(75) Inventor: Yuejian Wu, Kanata (CA)

(73) Assignee: Nortel Networks LImited, Quebec (CA)

( * ) Notice: Subject to any disclaimer, the term of this patent is extended or adjusted under 35 U.S.C. 154(b) by 163 days.

(21) Appl. No.: 09/749,945

(22) Filed: Dec. 29, 2000

(51) Int. Cl.[7] .................................................. G11C 7/00
(52) U.S. Cl. .................... 365/201; 365/230.05; 365/233
(58) Field of Search ................................. 365/201, 154, 365/156, 230.05, 230.02, 189.02, 189.05, 189.08, 233

(56) References Cited

U.S. PATENT DOCUMENTS

| | | | |
|---|---|---|---|
| 5,812,469 A | | 9/1998 | Nadeau-Dosite et al. ... 365/201 |
| 6,333,872 B1 | * | 12/2001 | Ouellette et al. ...... 365/189.06 |
| 6,496,950 B1 | * | 12/2002 | Zhao et al. .................. 714/718 |
| 6,501,692 B1 | * | 12/2002 | Melanson et al. .......... 365/201 |
| 6,510,530 B1 | * | 1/2003 | Wu et al. ...................... 714/30 |

OTHER PUBLICATIONS

Nadeau–Dostie, B., SilBurt, A. and Agrawal, V.K., "A Serial Interfacing Technique for External and Built–In Self–Testing of Embedded Memories", IEEE Design and Test of Computers, vol. 7, No. 2, pp. 54–64, Apr. 1990.

Wu, Y. and Gupta, S., "Built–In Self–Test for Multi–Port RAMs", Proc. 6th Asian Test Symp., pp. 398–403, Nov. 1997.

van de Goor, A.J., Testing Semiconductor Memories: Theory and Practice, John Wiley & Sons, Ltd., England, 1991.

* cited by examiner

*Primary Examiner*—Richard Elms
*Assistant Examiner*—Hien Nguyen
(74) *Attorney, Agent, or Firm*—Hunton & Williams

(57) ABSTRACT

A technique for testing a static random access memory comprising at least the first port and a second port is disclosed. In one embodiment, the technique may be realized by testing the memory with values through the first port while applying one of a shadow write and a shadow read from the second port and testing the memory through the second port while applying one of the shadow write and the shadow read from the first port. The shadow write may be designed to write specified values into cells of the memory not being tested where the specified values are opposite to values used in testing the memory. The shadow read may be designed to read values from memory that are opposite to the values used in testing the memory.

34 Claims, 10 Drawing Sheets

SYSTEM AND METHOD FOR TESTING TDM SRAMS

FIELD OF THE INVENTION

The present invention relates generally to sRAMs and, more particularly, to a technique for testing time domain multiplex sRAMs.

BACKGROUND OF THE INVENTION

Time Domain Multiplex ("TDM") static random access memories ("sRAMs") have found a wide range of applications in telecommunication application specific integrated circuits ("ASIC") due to their small area and flexibility.

Time Domain Multiplex sRAM is a new multi-port memory design methodology. In a TDM sRAM, a single set of read/write and address decoding circuitry as well as a single set of word/bit lines are shared among multiple ports in a time slice fashion. Thus, in a single system clock cycle, each port is given a fraction of the cycle time to access the memory through the same read/write circuitry as well as the same address decoder. Compared to a conventional multi-port memory, a TDM sRAM that supports the same number of ports as the conventional one occupies significantly less silicon area. In addition, it draws less peak current. As a result, TDM sRAMs are becoming more and more attractive to telecommunication ASICs, which usually embed a large number of multi-port memories.

The use of TDM sRAMs has helped reduce silicon area of multi-port memories, thus allowing the integration of more functionality into an ASIC. It has also created new challenges for testing. In a single system clock cycle, a TDM sRAM is accessed multiple times through different ports. The fundamental mechanism that supports such multiple accesses in a single clock cycle is an internal clock generator that clocks the core of the TDM sRAM many times faster than the system clock. For a m-port TDM sRAM, the memory core may run m times faster than the circuits that access it. Thus, the memory may run at an internal clock that is m times faster than the system clock. A slow system clock coupled with a fast internal clock creates new challenges for at-speed testing of TDM sRAMs, especially if the test is conducted with built-in self-test ("BIST") circuitry on boards or in systems.

This slow system clock coupled with fast internal clock makes it difficult to achieve high test quality with conventional BIST techniques, especially for timing related faults. This is because conventional test approaches for TDM sRAM disable the internal clocks and use the system clock to test the memory as if it is a conventional single port memory. The clock generator itself is then tested using scan test vectors.

Since the system clock is usually much slower than the internal clocks, especially when the ASIC is tested on a board or in a system, the conventional test approaches cannot cover timing related defects in the memory. The approach described in U.S. patent application Ser. No. 09/401,976, "At-speed Built-in Self-Testing of Compact SRAM", herein incorporated by reference, does not provide complete coverage of timing related defects.

In view of the foregoing, it would be desirable to provide a technique for testing TDM sRAMs which overcomes the above-described inadequacies and shortcomings. More particularly, it would be desirable to provide a technique for testing TDM sRAMs in an efficient and cost effective manner.

SUMMARY OF THE INVENTION

According to the present invention, a technique for testing sRAMs is provided. In one embodiment, the technique is realized by a method for testing a static random access memory ("sRAM"). The process includes a technique for testing a static random access memory ("sRAM") having a plurality of ports is disclosed. In one embodiment, the technique is realized by testing the memory with values through a first port while applying one of a shadow write where a shadow read from a second port and testing the memory through the second port while applying one of the shadow write and the shadow read from the first port. The shadow write may be designed to write specified values into cells of the memory not being tested where the specified values are opposite to values used in testing the memory. The shadow read may be designed to read values from memory that are opposite to the values used in testing the memory, even though the shadow read results are not examined.

In accordance with other aspects of the present invention, the sRAM may be partitioned into two equal portions based on rows and/or columns. Each half of the memory may be tested through each of the ports while a shadow write or shadow read is applied through the other port over the other half of the memory.

In accordance with further aspects of the present invention, a conventional BIST controller may be used to perform the TDM sRAM testing algorithm.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

Figure 1:
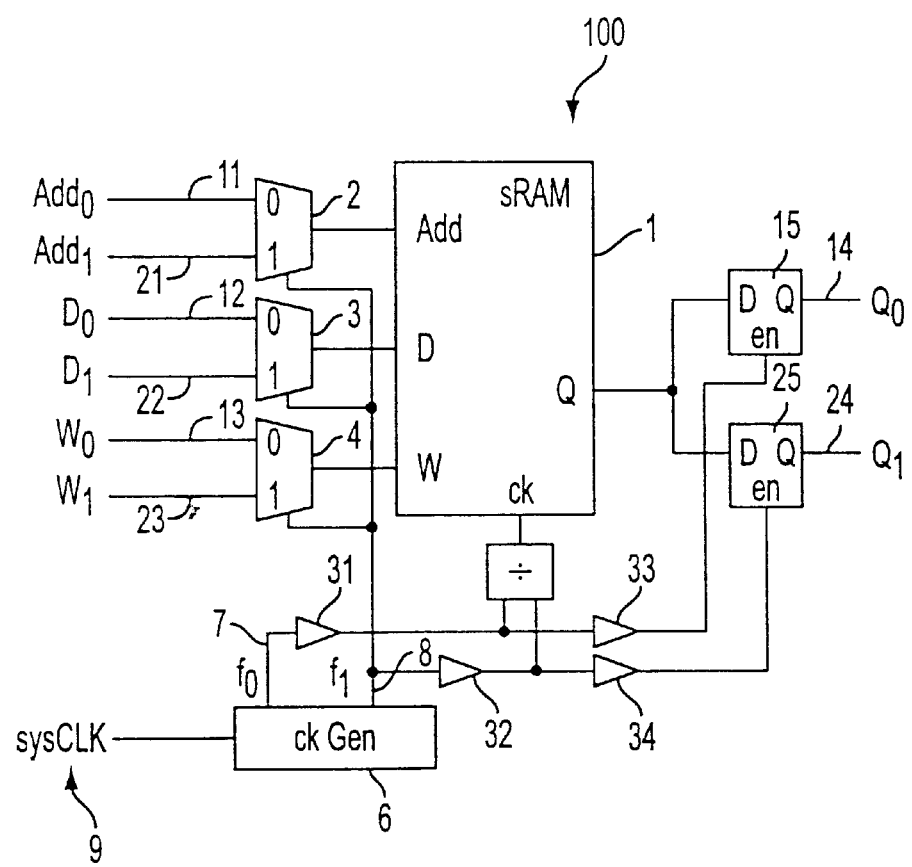
FIG. 1 is a circuit diagram illustrating one embodiment of a TDM SRAM for testing in accordance with the present invention.

Referring to FIG. 1, there is shown the architecture of a 2-port TDM sRAM for testing according to the present invention. FIG. 1 shows a block diagram of one embodiment of a 2-port TDM sRAM. The TDM sRAM includes a sRAM 1, buffers 31–34, a clock generator 6, multiplexers ("MUXs") 2–4, output latches 14, 24 and system clock 9.

The sRAM 1 may be conventional single port sRAM. The buffers 31–34 may represent delays, and the clock generator 6 may be an internal clock generator that produces internal clocks $f_0$ 7 and $f_1$ 8, based on the system clock input sysCLK 9. Signals $W_0$ 13, $D_0$ 12, $Add_0$ 11 and $Q_0$ 14 represent write enable, data input, address and data output for port 0 of the TDM sRAM 100. Similarly, signals $W_1$ 23, $D_1$ 22, $Add_1$ 21 and $Q_1$ 24 represent write enable, data input, address and data output for port 1 of the TDM sRAM 100.

Figure 2:
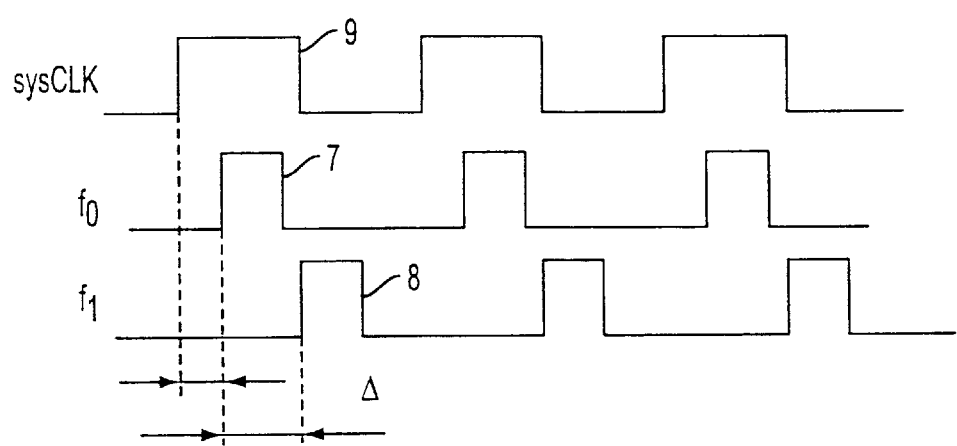
FIG. 2 is a graph illustrating one embodiment of the relationships between the system clock and internal clocks of the TDM SRAM illustrated in FIG. 1.

FIG. 2 is a graph illustrating one embodiment of the timing relationships of the system clock 9 and internal clocks $f_0$ 7 and $f_1$ 8. As shown, each sysCLK 9 rising edge triggers a $f_0$ 7 pulse and a $f_1$ 8 pulse. The timing relationship between sysCLK 9, $f_0$ 7 and $f_1$ 8 may be fixed. Thus, the pulse width of $f_0$ 7 and $f_1$ 8 may be fixed and the phase shifts of $f_0$ 7 and $f_1$ 8, with respect to sysCLK's 9 rising edge, may be fixed and independent of sysCLK's 9 cycle time. As a result, at each sysCLK 9 rising edge, independent of sysCLK's 9 frequency, the sRAM may be accessed twice at a fixed frequency of 1/Δ, which is usually the highest frequency that the sRAM technology allows.

Referring to FIG. 1, before each sysCLK 9, $W_0/W_1$ 13, 23, $D_0/D_1$ 12, 22 and $Add_0/Add_1$, 11, 22 are presented to the TDM sRAM 1. Upon the arrival of a sysCLK 9 rising edge, the clock generator 6 may produce a $f_0$ 7 pulse. The $f_0$ 7 pulse allows access to the sRAM 1 based on $W_0$ 13, $Add_0$ 11 and $D_0$ 12 since $f_1=0$ at this time. If $W_0=1$, a write operation may write $D_0$ 12 into the memory at the address defined by $Add_0$ 11. If $W_0=0$, a read operation may read the memory from the address defined by $Add_0$ 11 and latch the read out data in the corresponding output latch 14.

After a certain amount of delay, the clock generator 6 may produce a second clock pulse $f_1$ 8. The $f_1$ 8 allows access to the memory according to the values of $W_1$ 23, $Add_1$ 21 and $D_1$ 22.

As shown in FIG. 1, with the internal clock generator 6, a conventional single port sRAM 1 may serve two independent ports. The same architecture may apply to multiple port TDM sRAM's using a single port or multiple port conventional sRAM.

Since the TDM sRAM 100 contains a conventinoal sRAM as a core, conventional sRAMs faults should considered for TDM sRAM testing. In addition, TDM sRAMs 100 may have other types of faults.

The faults that should be considered in testing TDM sRAMs include basic sRAM core faults, coupling faults within a word, coupling faults within the sRAM core, faults that prevent $f_0$ and/or $f_1$ from accessing the entire memory space, interferences between data inputs $D_0$ and $D_1$, interferences between data outputs $Q_0$ and $Q_1$, bit line delay faults inside the sRAM core, delay faults on sRAM write enable, delay faults on address buses and interferences between addresses $A_0$ and $A_1$.

Basic SRAM core faults include core cell stuck-at faults, transition faults, read/write/precharge circuit faults and address decoding faults. These faults may be tested with any March test. In TDM sRAM, these faults are covered as long as a March test is run on the sRAM using either $f_0$ or $f_1$ with certain care. For example, if $f_0$ is used to conduct a March test, $f_1$ should operate outside the memory space that $f_0$ operates on. Thus, $f_1$ will not interfere with the March test being conducted with $f_0$ when no defect exists.

A March test is a deterministic memory test algorithm. In a March test a finite sequence of tests are performed on every cell in a memory array before moving on to the next cell. All array cells are traversed in order, either forwards or backwards, and subjected to the same tests.

The coverage for coupling faults within the same word may be the same for both conventioanal sRAMs and TDM sRAMs.

For a conventional sRAM, coupling faults within the sRAM may be testable with any March test. In a TDM sRAM environment, however, the coverage of these faults may depend on how the TDM sRAM is tested. For example, if $f_0$ and $f_1$ always operate on the same column but different rows, some coupling faults from certain rows on which $f_0$ operates to certain other rows on which $f_1$ operates may not be covered. For example, the coupling effect due to $f_0$ could be overwritten by the operation of $f_1$. However, if $f_0$ and $f_1$ always operate on the same row but different columns, some coupling faults between certain columns on which $f_0$ operates and certain other columns on which $f_1$ operates may not be covered. Therefore, a thorough test for these faults would be to operate $f_0$ and $f_1$ on different rows and different columns. An alternative may be to conduct the test with $f_0$ and $f_1$ on the same column but different rows first and followed by another test with $f_0$ and $f_1$ on the same rows but different columns.

Faults that prevent $f_0$ and/or $f_1$ from accessing the entire memory space is a TDM sRAM specific fault. One simple test for this fault may include running $f_0$ over the entire memory space and running $f_1$ over the entire memory space. Thus, it may be ensured that both $f_0$ and $f_1$ are able to access the entire memory space.

Interferences between the data inputs $D_0$ and $D_1$ is another TDM sRAM specific fault. One test for this fault may include writing $D_0$ into the memory while holding $D_1$ to the opposite value of $D_0$ and vice versa.

Interferences between the data outputs $Q_0$ and $Q_1$ is also a TDM sRAM specific fault. One potential test for this fault may include reading data d from $Q_0$ immediately followed with reading $\underline{d}$ from $Q_1$.

Bit line delay faults inside the sRAM core are conventional faults. In a TDM sRAM test, however, these faults may be covered only if a write d is conducted with $f_0$ immediately followed by reading d with $f_1$ and vice versa. This fault may be targeted by a shadow write test.

Delay faults on sRAM write enable are a combination of conventional faults and TDM sRAM specific faults. The behavior of such faults is to prevent at-speed switching between read and write or vice versa. These types of faults are conventional if such a fault exists inside the sRAM core. These faults are TDM sRAM specific if such a fault exists in the MUX 4 for $W_0$ 13 and $W_1$ 23. The detection of these faults in a TDM sRAM may require a write operation with $f_0$ 7 immediately followed by a read operation with $f_1$ 8 or vice versa.

Delay faults on address buses are a also combination of conventional faults and TDM sRAM specific faults. One test for this fault may include applying opposite addresses on $A_0$ 11 and $A_1$ 21.

Interferences between addresses $A_0$ 11 and $A_1$ 21 is a TDM fault. A test for this fault may include applying opposite addresses to both $A_0$ 11 and $A_1$ 21.

Figure 3:
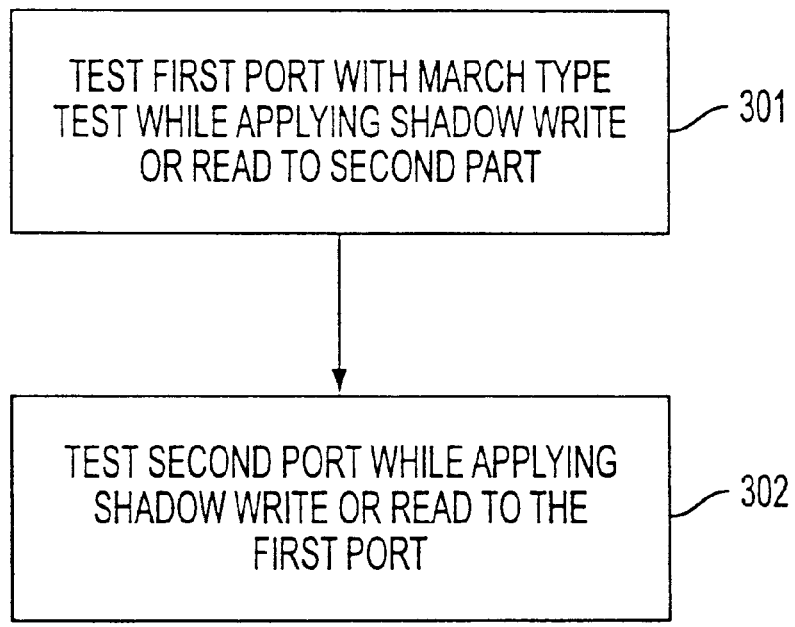
FIG. 3 is a flow diagram illustrating one embodiment of a method for testing TDM sRAMs in accordance with the present invention.

FIG. 3 is a flow diagram illustrating one embodiment of a method for testing TDM sRAMs in accordance with the present invention.

At step 301, a first port of the TDM sRAM may be tested with a March type test while a shadow write or shadow read is applied to a second port of the TDM sRAM. At step 302, the second port of the TDM sRAM may be tested with the March type test while a shadow write or read is applied to the first port. If the sRAM includes more than two ports, each port may be tested while the shadow write is applied to or the shadow read applied from the other ports.

The shadow write or shadow read may force values opposite to the values used by the March type test for addresses and data, as described below.

Shadow write and read have been proposed for testing conventional multi-port sRAMs. In one approach, shadow write was used for testing inter-port bridging faults in a multi-port memory, as described in "A Serial Interfacing Technique for External and Built-In Self-Testing of Embedded Memories," Nadeau-Dostie, B., SilBurt, A. and Agrawal, V. K., IEEE Design and Test of Computers, Vol. 7, No. 2, pp. 54–64, April 1990 ("A Serial Interfacing Technique"), herein incorporated by reference. Shadow write provides good coverage for the inter-port bridging faults. However, it requires memory modification to enable it, which is not always possible in practice. In another approach, another type of test called shadow read or pseudo read was proposed to deal with inter-port bridging faults without memory modification, as described in "Built-In Self-Test for Multi-Port RAMs," Wu, Y. and Gupta, S., Proc. $6^{th}$ Asian Test Symp., pp.398–403, November 1997, herein incorporated by reference, and "Method and Apparatus for testing multi-port memory," U.S. Pat. No. 5,812,469, Nadeau-Dostie et al., herein incorporated by reference.

The concept and terminology of shadow write and read may be used to achieve high test quality for TDM sRAMs.

In one approach, for a conventional multi-port memory test, a shadow read may include applying a conventional single-port test, e.g. March test, on one port of the memory while conducting read operations from all other ports simultaneously, as described in Built-in Self-Test for Multi-Port RAMs and U.S. Pat. No. 5,812,469. However, the data read out from all the other ports are not examined. These reads are called shadow reads. If the memory is free of any inter-port short, these shadow read operations have no effect on the port under the March test. However, in the presence of inter-port bridging faults, the shadow read will activate the faults so that they may be detected from the port under the March test.

In a TDM sRAM environment, a shadow read may behave in a similar way conceptually even though the shadow reads are aimed to detect faults outside the sRAM core. In a TDM SRAM, if a conventional test such as March is performed with $f_0$ 7, the shadow read may be performed with $f_1$ 8 in a different address space. The shadow read here is mainly for detecting interferences, including bridging faults and other types of coupling faults outside the sRAM, between $Q_0$ 14 and $Q_1$ 24.

A difference between the shadow read described in accordance with the present invention and that used in conventional approaches for sRAMs is that in the conventional approaches, the shadow read has no specified value. Here, the proposed shadow read is designed to always read an opposite value to what the actual read expects from the port under the March test even though the shadow read results are not examined.

In the absence of any interference between $Q_0$ 14 and $Q_1$ 24, the shadow read has no effect on the March test performed on the other port. If an interference exists, such as a bridging fault, a shadow read on one port may activate the fault so that it can be detected from the other port under the March test. Shadow read may be performed with either $f_0$ 7 or $f_1$ 8.

In conventional multi-port memory tests, shadow write may be used to detect inter-port bridging faults. In TDM sRAM, shadow write may be used to detect timing defects inside the sRAM core, such as slow pre-charge circuitry and weak core memory cells, etc. Here, the just the terminology of shadow write is borrowed. The concept of the proposed shadow write and the actual realization are quite different from conventional shadow writes. In conventional approaches, shadow write may be a feature of the memory under test, requiring memory modification to include it. In comparison, the shadow write of the present invention may be a feature of the BIST controller, thus requiring no memory modification.

In one conventional approach, when a conventional test such as March is performed on one port of a multi-port memory, all the other ports may be placed into a shadow write mode. In this mode, write drivers from all the other ports are enabled with all word lines turned off. This way, if no inter-port short exists, no memory cells will be affected by the shadow write because no word line is selected. In the presence of such a fault, the shadow write drivers write into memory cells that will be detected from the port under the March test. In the conventional approach described in A Serial Interfacing Technique, the shadow write requires memory modification so that the shadow write feature is included as part of the memory.

The shadow write of the present invention is quite different from the conventional approach in that, in TDM sRAM testing, shadow writes actually write specified values into the memory cells. The shadow write only operates on the memory cells that are not under the March test. In addition, the value written with the shadow write never gets examined during test. For example, if $f_0$ 7 is used to conduct a March test on address $Add_0$ 11 ranging from row 0 to row r/2, shadow write may be performed with $f_1$ 8 on address $Add_1$ 21 ranging from row r/2+1 to row r−1, where r is the number of rows in the sRAM core.

As discussed above, the proposed shadow write may be used for detecting timing defects in the conventional sRAM core with a slow system clock. If the memory is clean of any timing defect, the shadow write with $f_1$ 8 would have no effect on the March test performed with $f_0$ 7. However, if a timing defect exists, the shadow write with $f_1$ 8 may cause the March test with $f_0$ 7 to fail. As with the shadow read, the shadow write may be performed from either port 0 or port 1.

Figure 4:
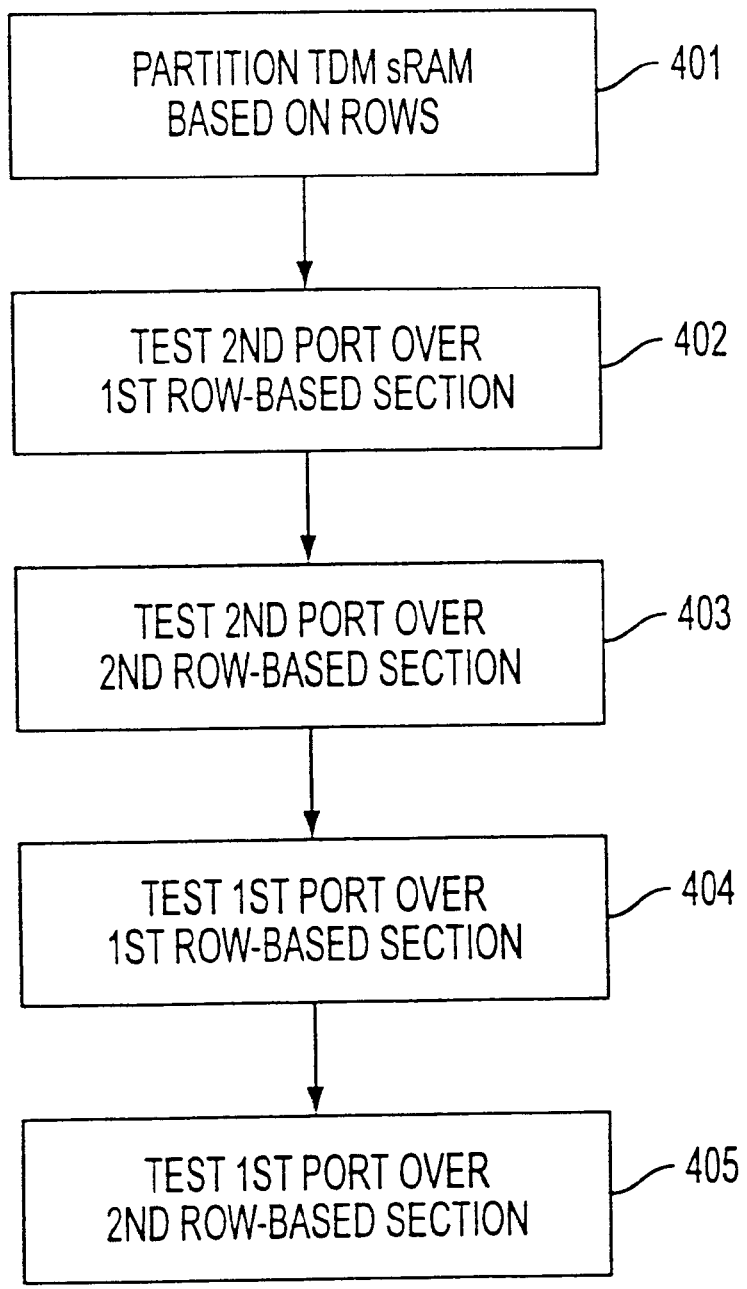
FIG. 4 is a flow diagram illustrating one aspect of the method of FIG. 3 in more detail.

FIG. 4 is a flow diagram illustrating one aspect of the method of FIG. 3 in more detail. At step 401, a TDM sRAM may be partitioned into two equal sections based on rows, for TDM sRAMs having two ports. For sRAMs including more than two ports, the sRAM may be partitioned into a number of sections corresponding to the number of ports. For example, if the sRAM has four ports, the sRAM may be partitioned into four equal sections.

At step 402, the second port of the TDM sRAM may be tested over a first row-based section while a shadow write is applied from the first port over a second row-based section.

At step 403, the second port of the TDM sRAM may be tested over the second row-based section while a shadow write is applied from the first port over the first row-based section.

At step 404, the first port of the TDM sRAM may be tested over the first row-based section while a shadow write is applied from the second port over the second row-based section.

At step 405, the first port of the TDM sRAM may be tested over the second row-based section while a shadow write is applied from the second port over the first row-based section.

When the sRAM has more than two ports, each port may be tested over each section while the other ports have a shadow write applied to them or a shadow read applied from them.

The algorithm of FIG. 4 will now be described in more detail. It is desirable to have a TDM memory BIST technique that may be easily implemented with any commercial BIST controller of conventional memories. All customization for TDM memory testing should be able to fit in a modified memory collar.

For simplicity, the following description will assume a commercial BIST controller using the March-C test, the most popular test for conventional memories, unless otherwise noted. The proposed technique may be implemented with a conventional BIST controller of any march like test.

The method of FIG. 4 illustrates a basic algorithm for testing a TDM sRAM using a conventional BIST controller. Without losing generality, a two-port TDM memory is used as an example to present the basic idea of the proposed at-speed BIST technique, to analyse its fault coverage and to discuss its possible implementations. The proposed technique may easily be generalized to multiple port TDM memories. In addition, parallel test of the memory, i.e., apply tests one word at a time and read test responses one word at a time, is assumed. The proposed technique may be serialized to reduce both routing and BIST complexity. The serialization will be discussed below with reference to FIG. 8.

In the description, the following notations are assumed: w represents the number of words of the memory; n represents the number of bits per word; r represents the number of row address lines of the memory; c represents the number of column address lines of the memory; $ar_0[i]$ and $ar_1[i]$ represent row address bit i for ports 0 and 1 respectively, where $i=0, \ldots, \log_2(r-1)$; $ac_0[j]$ and $ac_1[j]$ represent column address bit j for ports 0 and 1 respectively, where $j=0, \ldots, \log_2(c-1)$; thus $Add_0=\{ar_0[r-1], \ldots, ar_0[\mathbf{0}], ac_0[c-1], \ldots, ac_0[\mathbf{0}]\}$ and $Add_1=\{ar_1[r-1], \ldots, ar_1[\mathbf{0}], ac_1[c-1], \ldots, ac_1[\mathbf{0}]\}$.

The basic idea of the proposed approach is to logically partition the memory into two sections of equal size and apply a test to one section from one port while conducting simultaneous shadow read and/or write over the other section from the other port.

The partition may be done in many different ways. For example, one approach may include partitioning the memory space into two sections of equal size based on rows. In other words, both sections in this partition may have non-overlap row address spaces. However, both sections should share the same column addresses, which is important to the detection of the bit line delay faults inside the sRAM core. The two sections of this partition may be denoted as sections $S_{r0}$ and $S_{r1}$. Both sections may have identical or opposite row addresses.

Another possible partition may include dividing the memory into two sections of equal size based on columns. In this partition, both sections may have non-overlap column address spaces. However, they may have identical row addresses, opposite row addresses or others. To achieve maximum coverage on address line delay faults, both sections may be defined to have opposite row and column addresses. This column-based partition may be represented as sections $S_{c0}$ and $S_{c1}$. A test with complete fault coverage may require more than one partition.

Many test algorithms have been proposed for testing sRAMs as described in Testing Semiconductor Memories: Theory and Practice, van de Goor, A.J., John Wiley & Sons, Ltd., England, 1991 ("Testing Semiconductor Memories"), herein incorporated by reference. Some of the test algorithms have been extended for testing multi-port conventional sRAMs, as described in A Serial Interfacing Technique, Built-In Self-Test for Multi-Port RAMs, and U.S. Pat. No. 5,812,469. Many of these test algorithms may be modified to test the TDM memories using the proposed technique. For example, the technique described with reference to FIGS. 4 and 5 is based on the March C-test algorithm as described in Testing Semiconductor Memories.

In the algorithms to be described, d represents a test vector of any value. For example, it may be any n-bit vector, such as 00 . . . 000 or 0101 . . . 0101, where n is the number of bits per word; $\underline{d}$ is the complement of d; Rd or R$\underline{d}$ represents a read d or $\underline{d}$ operation; Wd (W$\underline{d}$) represents a write d($\underline{d}$) operation; rd (r$\underline{d}$) represents a shadow read of value d ($\underline{d}$). It should be pointed out that the value from each shadow read is not examined. Similarly, wd (w$\underline{d}$) represents a shadow write. ( . . . ): ( . . . ) represents two simultaneous operatons on port 0 and port 1 respectively; the subscripts $upS_{r0}$ and $dnS_{r0}$ represent March up and March down tests, respectively, for row partitioned section $S_{r0}$; and subscripts $upS_{r1}$ and $dnS_{r1}$ represent March up and March down tests, respectively, for row partitioned section $S_{r1}$. The subscripts $upS_{c0}$ ($dnS_{c0}$) represents March up (down) test for column partitioned section $S_{c0}$; and subscripts $upS_{c1}$ ($dnS_{c1}$) represents March up (down) test for column partitioned section $S_{c1}$.

Figure 5:
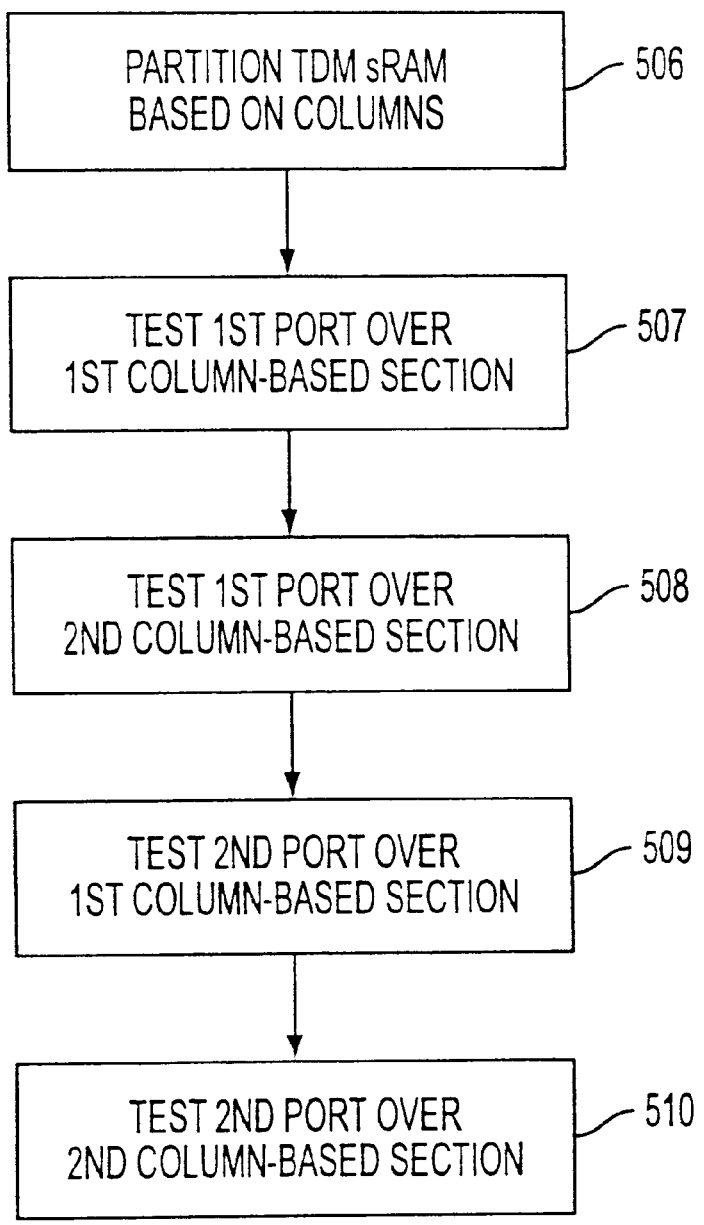
FIG. 5 is a flow diagram illustrating another aspect of the method of FIG. 3 in more detail.

The basic algorithm consists of two sub tests bTest_1 (FIG. 4) and bTest_2 (FIG. 5).

In bTest_1, the memory may be partitioned into two sections $S_{r0}$ and $S_{r1}$, based on rows. Shadow write may be used to cover memory bit line delay faults in addition to other conventional memory faults. Shadow write may first be conducted from port 0 and the March test may be performed on port 1. Then, the March test may be applied to port 0 and shadow write may be performed from port 1. In bTest_1, row address is advanced first.

The algorithm may include the following steps:

bTest_1:

1. $\{(rx)_{upSr1}:(Wd)_{dnSr0}\}$; //initialization of $S_{r0}$ from port 1;
2. $\{(w\underline{d}rx)_{upSr1}:(RdW\underline{d})_{dnSr0}\}$; //test of $S_{r0}$ from port 1 begins;
3. $\{(wdrx)_{upSr1}:(R\underline{d}Wd)_{dnSr0}\}$;
4. $\{(w\underline{d}rx)_{dnSr1}:(RdW\underline{d})_{upSr0}\}$;
5. $\{(wdrx)_{dnSr1}:(R\underline{d}Wd)_{upSr0}\}$;
6. $\{(w\underline{d}rx)_{upSr1}:(RdW\underline{d})_{dnSr0}\}$; //the test completes;
7. $\{(rx)_{upSr0}:(Wd)_{dnSr1}\}$; //initialization of $S_{r1}$ from port 1;
8. $\{(w\underline{d}rx)_{upSr0}:(RdW\underline{d})_{dnSr1}\}$; //test of $S_{r1}$ from port 1 begins;

9. $\{(wdrx)_{upSr0}:(R\underline{d}Wd)_{dnSr1}\}$;
10. $\{(w\underline{d}rx)_{dnSr0}:(RdW\underline{d})_{upSr1}\}$;
11. $\{(wdrx)_{dnSr0}:(R\underline{d}Wd)_{upSr1}\}$;
12. $\{(w\underline{d}rx)_{dnSr0}:(RdW\underline{d})_{dnSr1}\}$; //the test completes;
13. $\{(Wd)_{upSr0}:(wd)_{dnSr1}\}$; //initialization of $S_{r0}$ from port 0;
14. $\{(RdW\underline{d})_{upSr0}:(rxw\underline{d})_{dnSr1}\}$; //test of $S_{r0}$ from port 0 begins;
15. $\{(R\underline{d}Wd)_{upSr0}:(rxwd)_{dnSr1}\}$;
16. $\{(RdW\underline{d})_{dnSr0}:(rxw\underline{d})_{upSr1}\}$;
17. $\{(R\underline{d}Wd)_{dnSr0}:(rxwd)_{upSr1}\}$;
18. $\{(RdW\underline{d})_{upSr0}:(rxw\underline{d})_{dnSr1}\}$; //the test completes;
19. $\{(Wd)_{upSr1}:(wd)_{dnSr0}\}$; //initialization of $S_{r1}$ from port 0;
20. $\{(RdW\underline{d})_{upSr1}:(rxwd)_{dnSr0}\}$; //test of $S_{r1}$ from port 0 begins;
21. $\{(R\underline{d}Wd)_{upSr1}:(rxwd)_{dnSr0}\}$;
22. $\{(RdW\underline{d})_{dnSr1}:(rxw\underline{d})_{upSr0}\}$;
23. $\{(R\underline{d}Wd)_{dnSr1}:(rxwd)\ upS_{r0}\}$;
24. $\{(RdW\underline{d})_{upSr1}:(rxw\underline{d})_{dnSr0}\}$; //the bTest__1 completes;

In bTest__1, steps 1–12 correspond to testing port 1 with a March test while applying shadow write from port 0. During steps 1–6 402, port 1 conducts the March C over the address space of memory section Sr0. During steps 7–12 402, port 1 performs the March C over the address space defined by section Sr1. Similarly, steps 13–24 403, 404 correspond to testing port 0 with a March test and applying shadow write from port 1.

The major coverage contribution of this test is as follows. The bTest__1 algorithm may detect all address faults covered by March test. This is because each-port performs the March test over the entire memory address, first over the space defined by $S_{r0}$ and then over that defined by $S_{r1}$. This verifies the behavior of the address decoder.

The bTest__1 algorithm also covers all memory core cell stuck-at and transition faults, all coupling faults across columns, and all row coupling faults within the sections $S_{r0}$ and $S_{r1}$ because the March test is applied fully over each section. In addition, this test also detects a majority of row coupling faults across sections. However, the coverage is not complete. Therefore, bTest__2, described below with reference to FIG. 5, may be designed to detect all row coupling faults.

The bTest__1 algorithm may also cover delay faults on the bit lines of the memory 1. This coverage is due to the fact that each shadow write is always followed immediately by reading the opposite value of the shadow write data from the opposite port. For example, in step 2, shadow write w$\underline{d}$ from port 0 is followed by a read Rd from port 1 under the March test. The shadow write forces the bit lines to the opposite value of what the Rd expects. This imposes maximum stress in terms of timing for the precharge circuitry between each $f_0$ 7 and $f_1$ 8 clock. If there is no delay fault on the bit lines, the shadow write has no effect on the Rd from port 1. Otherwise, the Rd will fail.

Similarly, in step 14, shadow write w$\underline{d}$ with $f_1$ 8 from port 1 is immediately followed by a Rd with $f_0$ 7 on port 0. In terms of delay faults inside the sRAM core, steps 13–24 cover exactly the same faults as steps 1–12.

The bTest__1 algorithm also covers delay faults of the internal clock generator 6. Steps 1–12 detects delay faults of the clock generator 6 that delay the clock $f_0$ 7 so that it does not provide enough precharge time for a read operation with $f_1$ 8. Similarly, steps 13–24 detect delay faults of the clock generator 6 that delay clock $f_1$ 8 so that it does not provide enough time for the bit lines to precharge properly after a $f_1$ 8 cycle and before the next $f_0$ 7 cycle.

The bTest__1 algorithm further covers delay faults on the read/write enable circuitry in both the sRAM core 1 and the TDM mutiplexer 4 for $W_0$ and $W_1$. This is because each shadow write is always followed by a read operation from the opposite port.

The faults that are missed by bTest__1 include delay faults on address decoding and TDM multiplexers because both ports use identical column address and use identical values but one bit for the row address, interferences between TDM addresses $A_0$ 11 and $A_1$ 21 because identical addresses are provided to both ports except one row address bit in this test, and TDM coupling faults between $D_0$ and $D_1$, and between $Q_0$ and $Q_1$ because bTest__1 writes and reads identical data from both ports. Although the test covers most row coupling faults across sections, it misses some row coupling faults between sections.

All of the missed faults may be detected during bTest__2, described below with respect to FIG. 5.

FIG. 5 is a flow diagram illustrating another aspect of the method of FIG. 3 in more detail. At step 506, a TDM sRAM may be partitioned into two equal sections based on columns, for TDM sRAMs having two ports. For sRAMs including more than two ports, the sRAM may be partitioned into a number of sections corresponding to the number of ports. For example, if the sRAM has four ports, the sRAM may be partitioned into four equal sections.

At step 507, the first port of the TDM sRAM may be tested over the first column-based section while a shadow write or shadow read is applied from the second port over the second column-based section.

At step 508, the first port of the TDM SRAM may be tested over the second column-based section while a shadow write is applied from the second port over the first column-based section.

At step 509, the second port of the TDM sRAM may be tested over a first column-based section while a shadow write is applied from the first port over a second column-based section.

At step 510, the second port of the TDM SRAM may be tested over the second column-based section while a shadow write is applied from the first port over the first column-based section.

When the sRAM has more than two ports, each port may be tested over each section while the other ports have a shadow write applied to them or a shadow read applied from them.

The algorithm of FIG. 5 will now be described in more detail.

In bTest__2, the memory 1 may be partitioned 506 into two sections $S_{c0}$ and $S_{c1}$ based on columns. Both sections may receive opposite row addresses as well as opposite column address. The objective of this test is to cover the faults missed by bTest__1. In this test, column address may be advanced first. The bTest__2 may include the following algorithm.

bTest__2:
1. $\{(Wd)_{upSc0}:(w\underline{d})_{dnSc1}\}$; //initialization of $S_{c0}$;
2. $\{(RdW\underline{d})_{upSc0}:(r\underline{d}wd)_{dnSc1}\}$; //test of $S_{c0}$ from port 0 begins;
3. $\{(R\underline{d}Wd)_{upSc0}:(rdw\underline{d})_{dnSc1}\}$;
4. $\{(RdW\underline{d})_{dnSc0}:(r\underline{d}wd)_{upSc1}\}$;
5. $\{(R\underline{d}Wd)_{dnSc0}:(rdw\underline{d})_{upSc1}\}$;
6. $\{(RdW\underline{d})_{upSc0}:(r\underline{d}wd)_{dnSc1}\}$; //the test completes;
7. $\{(Wd)_{upSc1}:(w\underline{d})_{dnSc0}\}$; //initialization of $S_{c1}$ from port 0;
8. $\{(RdW\underline{d})_{upSc1}:(r\underline{d}wd)_{dnSc0}\}$; //test of $S_{c1}$ from port 0;
9. $\{(R\underline{d}Wd)_{upSc1}:(rdw\underline{d})_{dnSc0}\}$;
10. $\{(RdW\underline{d})_{dnSc1}:(r\underline{d}wd)_{upSc0}\}$;
11. $\{(R\underline{d}Wd)_{dnSc1}:(rdw\underline{d})_{upSc0}\}$;
12. $\{(RdW\underline{d})_{upSc1}:(r\underline{d}wd)_{dnSc0}\}$; //the test completes;

13. $\{(w\underline{d})_{upSc1}:(Wd)_{dnSc0}\}$; //initialization of $S_{c0}$ from port 1;
14. $\{(r\underline{d}wd)_{upSc1}:(Rdw\underline{d})_{dnSc0}\}$; //test of $S_{c0}$ from port 1 begins;
15. $\{(rdw\underline{d})_{upSc1}:(R\underline{d}Wd)_{dnSc0}\}$;
16. $\{(r\underline{d}wd)_{dnSc1}:(RdW\underline{d})_{upSc0}\}$;
17. $\{(rdw\underline{d})_{dnSc1}:(R\underline{d}Wd)_{upSc0}\}$;
18. $\{(r\underline{d}wd)_{upSc1}:(RdW\underline{d})_{dnSc0}\}$; //the test completes;
19. $\{(w\underline{d})_{upSc0}:(Wd)_{dnSc1}\}$; //initialization of $S_{c1}$ from port 1;
20. $\{(r\underline{d}wd)_{upSc0}:(RdW\underline{d})_{dnSc1}\}$; //test of $S_{c1}$ from port 1 begins;
21. $\{(rdw\underline{d})_{upSc0}:(R\underline{d}Wd)_{dnSc1}\}$;
22. $\{(r\underline{d}wd)_{dnSc0}:(RdW\underline{d})_{upSc1}\}$;
23. $\{(rwd\underline{d})_{dnSc0}:(R\underline{d}Wd)_{upSc1}\}$;
24. $\{(r\underline{d}wd)_{upSc0}:(RdW\underline{d})_{dnSc1}\}$; //bTest_1 completes;

In bTest_2, steps 1–12 correspond to testing port 0 with a March test while conducting simultaneous shadow write or shadow read from port 1. Steps 1–6 507 may apply the March C-test to section $S_{c0}$ from port 0 and shadow write or read to section $S_{c1}$ from port 1. Steps 7–12 508 may apply the March test to section $S_{c1}$ from port 0 while applying shadow write or read from port 1 in section $S_{c0}$. Similarly, steps 13–24 509,510 correspond to testing port 1 with a March test while performing shadow write or read from port 0.

The shadow write and read used here force values opposite to what the March test uses for both address and data. Even though the data from shadow write and read are never evaluated, they ensure that each March operation experiences a transition on all wires of its address and data for each pair of $f_0$ 7 and $f_1$ 8. This provides the maximum stressing in terms of delay faults. If the memory is free of delay and TDM coupling fault, the shadow write and read have no effect on the March test. Otherwise, the shadow write and read will cause the March test to fail.

The algorithm bTest_2 may cover delay faults in both row and column address decoding because the test applies opposite addresses to both ports. It may also cover TDM coupling faults on the row and column addresses between port 0 and port 1 because the two ports are always provided with opposite addresses. The bTest_2 algorithm further covers TDM coupling faults between $D_0$ and $D_1$ as well as between $Q_0$ and $Q_1$ because the test uses opposite test data for port 0 and port 1. Btest_2 covers all delay faults on the input and output data buses, including those in the sRAM core 1 and those in the TDM multiplexers 2–4 because each data line switches for every pair of $f_0$ 7 and $f_1$ 8.

Btest_2 also covers all the memory row coupling faults, including those missed by bTest_1. This is because each March test in bTest_2 is applied to entire rows of the memory.

All of the faults that are missed by bTest_2 are covered by bTest_1. This includes memory bit line delay faults and column coupling faults across sections $S_{c0}$ and $S_{c1}$.

BTest_1 and bTest_2 each covers a subset of faults in the memory as well as in the TDM circuitry. To achieve a complete coverage, it may be necessary to apply both bTest_1 and bTest_2 one after another. The test time required may be equivalent to applying the March C- to four single port sRAM each of the size of the TDM memory. In other words, it takes twice as much time as testing two convetional 2-port sRAM of the same size as the TDM memory. Test time may be reduced, as described below with reference to FIG. 6.

Although the basic test algorithm may not be optimal in test time, it requires minimal hardware since the TDM memory is tested one port at a time, thus requiring a minimum number of comparators. The minimal hardware requirement is important for parallel BIST implementations, especially for testing wide memories. For serial BIST implementations using SMARCH tests, as described in A Serial Interfacing Technique and Built-In Self-Test for Multi-Port RAMS, the hardware increase due to the increase in the number of comparators is negligible. Therefore, it is important to optimize test time in a serialized BIST implementation. The serialized BIST for TDM memories will be discussed below with reference to FIG. 9.

There are different ways to reduce the test time of the basic algorithm. For example, one approach may change shadow read/write into real read/write and test both ports simultaneously. This may reduce the test time of the basic algorithm by half. However, this approach would require a new BIST controller that is able to test both ports simultaneously with the defined algorithm.

Another approach may include reducing the test time by half using a conventional BIST controller with all required modification included in a memory collar. In this way, a conventional BIST controller may be used without incurring the cost of a new BIST controller development and maintenance.

In bTest_2, one port may be tested at a time while placing the other port into shadow read or write. In another approach, both ports may be tested at the same time, thus reducing the test time of bTest_2 by half. This test time reduction does not sacrifice any fault coverage. However, it does require additional hardware in the BIST controller because testing both ports at the same time requires twice as many comparators for examining the test results as compared to testing one port at a time. This hardware increase may be significant for memories with large word width and tested with a parallel BIST controller. However, for a serial BIST controller, the hardware increase is negligible because it only requires one additional comparator, which may include a single flip-flop plus an XOR gate.

The modified bTest_2 may include the following algorithm:

MTest_2:
1. $\{(Wd)_{upSc0}:(W\underline{d})_{dnS1}\}$; //init. for port 0 (1) to test $S_{c0}$ ($S_{c1}$);
2. $\{(RdW\underline{d})_{upSc0}:(R\underline{d}Wd)_{dnSc1}\}$; //the test begins;
3. $\{(R\underline{d}Wd)_{upSc0}:(RdW\underline{d})_{dnSc1}\}$;
4. $\{(RdW\underline{d})_{dnSc0}:(R\underline{d}Wd)_{upSc1}\}$;
5. $\{(R\underline{d}Wd)_{dnSc0}:(RdW\underline{d})_{upSc1}\}$;
6. $\{(RdW\underline{d})_{upSc0}:(R\underline{d}Wd)_{dnSc1}\}$; //the test completes;
7. $\{(Wd)_{upSc1}:(W\underline{d})_{dnSc0}\}$; //init. for port 0 (1) to test $S_{c1}$ ($S_{c0}$);
8. $\{(RdW\underline{d})_{upSc1}:(R\underline{d}Wd)_{dnSc0}\}$; //the test begins;
9. $\{(R\underline{d}Wd)_{upSc1}:(RdW\underline{d})_{dnSc0}\}$;
10. $\{(RdW\underline{d})_{dnSc1}:(R\underline{d}Wd)_{upSc0}\}$;
11. $\{(R\underline{d}Wd)_{dnSc1}:(RdW\underline{d})_{upSc0}\}$;
12. $\{(RdW\underline{d})_{upSc1}:(R\underline{d}Wd)_{dnSc0}\}$; //MbTest_2 completes;

The time complexity of MTest_2 is only half of what bTest_2 requires, with the same fault coverage.

Figure 6:
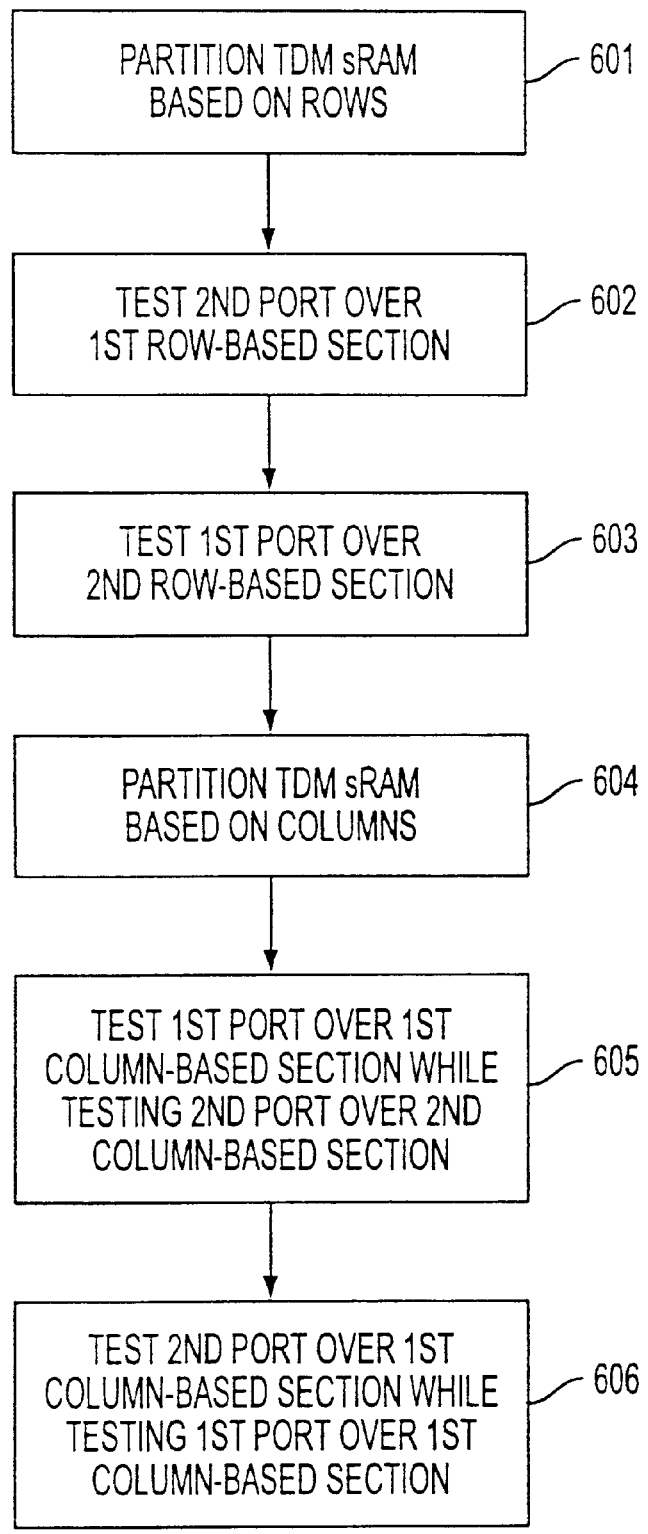
FIG. 6 is a flow diagram illustrating another embodiment of the method for testing TDM sRAMs.

FIG. 6 is a flow diagram illustrating another embodiment of the method for testing TDM sRAMs. At step 601, a TDM sRAM may be partitioned into two equal sections based on rows for a TDM sRAM having two ports. For sRAMs including more than two ports, the sRAM may be partitioned into a number of sections corresponding to the number of ports. For example, if the sRAM has four ports, the sRAM may be partitioned into four equal sections.

At step 602, the second port of the TDM sRAM may be tested over a first row-based section while a shadow write is applied from the first port over a second row-based section.

At step 603, the first port may be tested over the second row-based section while applying a shadow write to the first row-based section from the first port.

At 604, the TDM sRAM may be partitioned into two equal sections based on columns. At step 605, the first port may be tested with a March type test over the first column-based section while the second port is tested over the second column-based section with a March type test.

At step 606, the second port may be tested with a March type test over the first column-based section while the first port is tested over the second column-based section with a March type test.

The algorithm of FIG. 6 will now be described in more detail.

Assuming that MTest_2 will be applied along with bTest_1, the real contribution of bTest_1 would be to cover delay faults of the bit lines of the memory core, delay faults in the write enable circuitry and delay faults of $f_0$ in the internal clock generator. The steps 1–6 of bTest_1 provide full coverage of any delay fault in the precharge and in the write enable circuitry. In addition, steps 1–6 also cover weak memory cells in memory space defined by $S_{r0}$.

The contribution of steps 7–12 is to cover the weak memory cells in section $S_{r1}$, although they cover the precharge circuitry as well. The contribution of the steps 13–24 is to detect delay faults in the clock generator for $f_1$ 8, although they cover weak memory cells in both sections $S_{r0}$ and $S_{r1}$ also. Thus, there exists much redundancy in bTest_1.

In fact, under the assumption of single site bit line delay faults, steps 1–6 and 19–24 from bTest_1 yield the same coverage as bTest_1. This is because both steps 1–6 and steps 19–24 detect any delay fault in the precharge circuitry. Steps 1–6 cover weak memory cells in section $S_{r0}$. Step 19–24 cover weak memory cells in $S_{r1}$, even if the system clock 9 runs at a very slow frequency. This is because the read operation is controlled by a self timing circuit in the sRAM itself regardless of the sRAM clock frequency. In addition, steps 1–6 and 19–24 also cover delay faults in the internal clock generator 6 for both $f_0$ 7 and $f_1$ 8. Thus, bTest_1 may be simplified as follows.

MTest_1:
1. $\{(rx)_{upSr1}:(Wd)_{dnSr0}\}$; //initialization of $S_{r0}$ from port 1 ;
2. $\{(w\underline{d}rx)_{upSr1}:(RdW\underline{d})_{dnSr0}\}$; //test of $S_{r0}$ from port 1 begins;
3. $\{(wdrx)_{upSr1}:(RdWd)_{dnSr0}\}$;
4. $\{(w\underline{d}rx)_{dnSr1}:(RdW\underline{d})_{upSr0}\}$;
5. $\{(wdrx)_{dnSr1}:(RdWd)_{upSr0}\}$;
6. $\{(w\underline{d}rx)_{upSr1}:(RdW\underline{d})_{dnSr0}\}$; //the test completes;
7. $\{(Wd)_{upSr1}:(w\underline{d})_{dnSr0}\}$; //initialization of $S_{r1}$ from port 0;
8. $\{(RdW\underline{d})_{upSr1}:(rxw\underline{d})_{dnSr0}\}$; //test of $S_{r1}$ from port 0 begins;
9. $\{(R\underline{d}Wd)_{upSr1}:(rxwd)_{dnSr0}\}$;
10. $\{(RdW\underline{d})_{dnSr1}:(rxw\underline{d})_{upSr0}\}$;
11. $\{(R\underline{d}Wd)_{dnSr1}:(rxwd)_{upSr0}\}$;
12. $\{(RdW\underline{d})_{upSr1}:(rxw\underline{d})_{dnSr0}\}$; //the MTest_1 completes;

MTest_1 along with MTest_2 provide complete coverage of the TDM memory. The two algorithms may be combined into a TDM_Test as follows.

TDM_Test:
1. $\{(rx)_{upSr1}:(Wd)_{dnSr0}\}$; //initialization of $S_{r0}$ from port 1;
2. $\{(w\underline{d}rx)_{upSr1}:(RdW\underline{d})_{dnSr0}\}$; //test of $S_{r0}$ from port 1 begins;
3. $\{(wdrx)_{upSr1}:(RdWd)_{dnSr0}\}$;
4. $\{(w\underline{d}rx)_{dnSr1}:(RdW\underline{d})_{upSr0}\}$;
5. $\{(wdrx)_{dnSr1}:(Rdwd)_{upSr0}\}$;
6. $\{(w\underline{d}rx)_{upSr1}:(RdW\underline{d})_{dnSr0}\}$; //the test completes;
7. $\{(Wd)_{upSr1}:(w\underline{d})_{dnSr0}\}$; //initialization of $S_{r1}$ from port 0;
8. $\{(RdW\underline{d})_{upSr1}:(rxw\underline{d})_{dnSr0}\}$; //test of $S_{r1}$ from port 0 begins;
9. $\{(R\underline{d}Wd)_{upSr1}:(rxwd)_{dnSr0}\}$;
10. $\{(RdW\underline{d})_{dnSr1}:(rxw\underline{d})_{upSr0}\}$;
11. $\{(R\underline{d}Wd)_{dnSr1}:(rxwd)_{upSr0}\}$;
12. $\{(RdW\underline{d})_{upSr1}:(rxw\underline{d})_{dnSr0}\}$; //the test completes;
13. $\{(W\underline{d})_{upS0}:(Wd)_{dnS1}\}$; //initialization of both $S_0$ and $S_1$;
14. $\{(RdW\underline{d})_{upS0}:(RdW\underline{d})_{dnS1}\}$; //test begins to test $S_0$ from port 0 and
15. $\{(RdW\underline{d})_{upS0}:(RdWd)_{dnS1}\}$; //test $S_1$ from port 1;
16. $\{(RdW\underline{d})_{dnS0}:(RdW\underline{d})_{upS1}\}$;
17. $\{(RdW\underline{d})_{dnS0}:(RdW\underline{d})_{upS1}\}$;
18. $\{(RdW\underline{d})_{upS0}:(RdW\underline{d})_{dnS1}\}$; //the test completes;
19. $\{(W\underline{d})_{upS1}:(Wd)_{dnS0}\}$; //initialization of both $S_0$ and $S_1$;
20. $\{(RdW\underline{d})_{upS1}:(RdW\underline{d})_{dnS0}\}$; //test begins to test $S_1$ from port 0 and
21. $\{(RdW\underline{d})_{upS1}:(RdWd)_{dnS0}\}$; //test $S_0$ from port 1;
22. $\{(RdW\underline{d})_{dnS1}:(RdW\underline{d})_{upS0}\}$;
23. $\{(RdW\underline{d})_{dnS1}:(RdW\underline{d})_{upS0}\}$;
24. $\{(RdW\underline{d})_{upS1}:(RdW\underline{d})_{dnS0}\}$; //the whole test completes;

The test time of TDM_Test is equivalent to testing a conventional 2-port sRAM of the same size as the TDM memory. However, the TDM_Test may require additional hardware in the BIST controller for test result evaluation.

Figure 7:
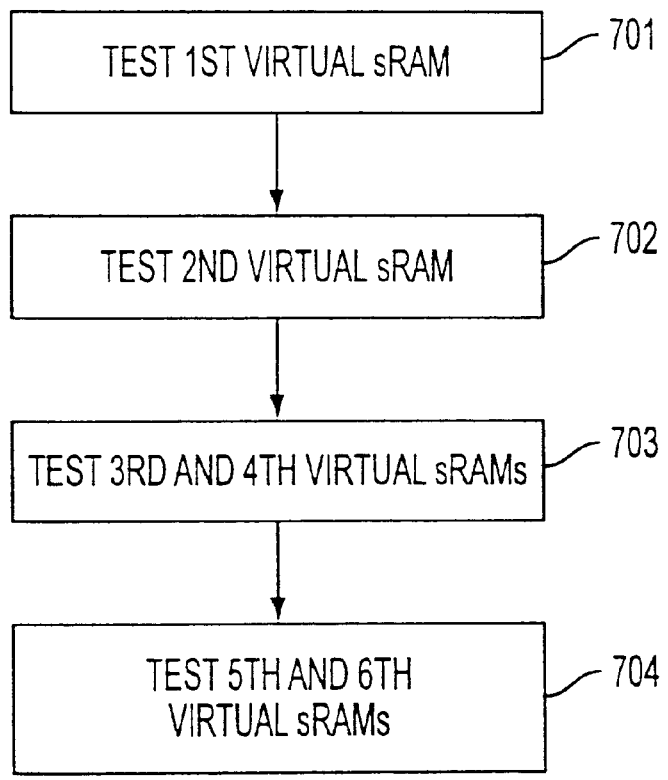
FIG. 7 is a flow diagram illustrating one embodiment of a method for testing TDM sRAMs using BIST.

FIG. 7 is a flow diagram illustrating one embodiment of a method for testing TDM sRAMs using BIST.

For testing purposes, it may be postured that the TDM memory includes six virtual sRAMs. If the TDM memory hash rows and $2^c$ columns, the first virtual sRAM may have h/2 rows and $2^c$ columns. The second virtual sRAM may have h/2 rows and $2^c$ columns.

The third, fourth, fifth and sixth sRAMs may have h rows and $2^{c-1}$ columns. If the TDM memory has w words and n bits per word, each of the virtual sRAMs may have w/2 words with n bits per word.

At step 701, the first virtual sRAM may be tested with row first addressing. At step 702, the second virtual sRAM may be tested with row first addressing.

At step 703, the third and fourth virtual sRAMs may be tested in parallel with column-first addressing.

At step 704, the fifth and sixth virtual sRAMs may be tested in parallel with column-first addressing.

The method of claim 7 will now be described in more detail.

There are different ways to implement the proposed test algorithm TDM_Test. One approach includes a BIST implementation using a commercial single port BIST controller with March C-test algorithm. In the proposed BIST implementation, all the modifications required to test a TDM memory may be included in a memory collar.

Memories usually contain a binary number of columns and even number of rows. In order to test a TDM memory of w words and n bits per word with h rows and $2^c$ columns, a conventional BIST controller may be created as if it is to test 6 virtual sRAMs, each with a half of the TDM memory size.

The test sequence of the conventional BIST controller may be configured as follows:
  test virtual sRAM1 with row first addressing 701;
  test virtual sRAM2 with row first addressing 702;
  test virtual sRAM3 and sRAM4 in parallel with column first addressing 703; and
  test virtual sRAM5 and sRAM6 in parallel with column first addressing 704.

Step 701 of FIG. 7 corresponds to step 602 of FIG. 6. Similarly, step 702 corresponds to step 603, step 703 corresponds to step 605 and step 704 corresponds to step 606.

Since testing two virtual memories in parallel does not take longer than testing a single one, the total test time for testing a TDM memory is equivalent to testing two single port sRAMs of the same size or tseting a single conventional 2-port sRAM of the same size.

Figure 8:
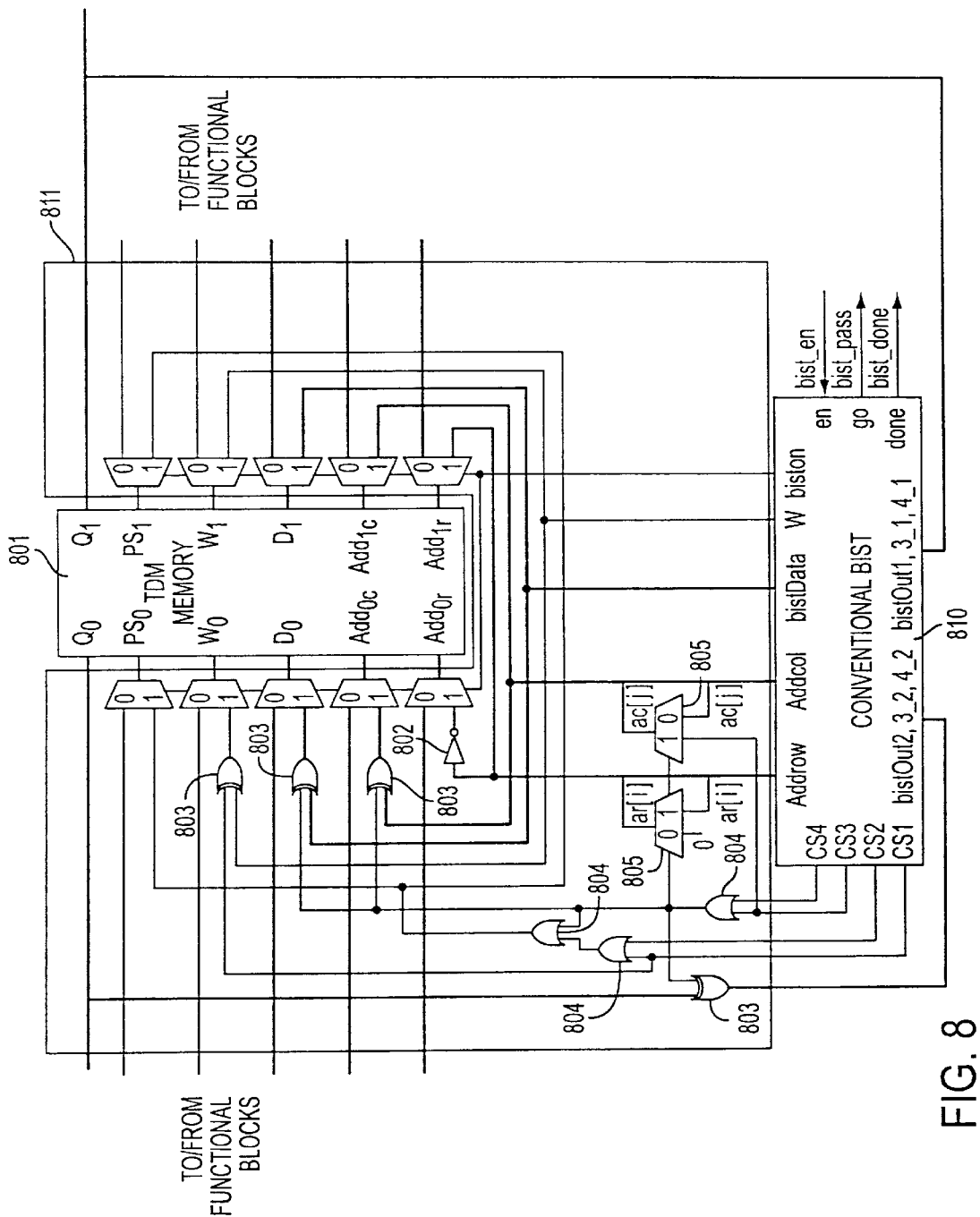
FIG. 8 is a circuit diagram illustrating one embodiment of a BIST suitable for testing a TDM sRAM in accordance with the method of the present invention.

Once a conventional BIST controller is generated, it is connected to a modified memory collar to test the TDM memory as shown in FIG. 8. Based on the BIST configuration described above, the BIST controller generated should provide four chip select signals CS1, CS2, CS3 and CS4 accordingly. When (CS1, CS2, CS3, CS4)=(1,0,0,0), the BIST may test virtual sRAM1. When (CS1,CS2, CS3, CS4)=(0,1,0,0), BIST may test virtual sRAM2. When (CS1, CS2, CS3, CS4)=(0,0,1,0), the BIST may test virtual sRAM3 and virtual sRAM4 in parallel. Finally, when (CS1, CS2, CS3, CS4)=(0,0,0,1), the BIST may test virtual sRAM5 and virtual sRAM6 in parallel.

FIG. 8 is a circuit diagram illustrating one embodiment of a BIST suitable for testing a TDM sRAM in accordance with the method of the present invention. The BIST 810 may be a conventional BIST. The BIST is shown having a collar 811 for use with a TDM Memory 801. The BIST collar may include at least one inverter 802, XOR gates 803, OR gates 804 and muxs 805.

The BIST may work as follows. When (CS1,CS2,CS3, CS4)=(1,0,0,0), the March C-test may be applied to port 1 while port 0 is placed into the shadow write and read. In this case, $W_0$ 13 may be inverted from what the BIST controller provides. In addition, the bit i of the row address, ar[i], from the BIST controller may be forced to 0, where $0 \leq i < r$. Thus, row address ar[i] to port 0 is forced to 1 while row address ar[i] to port 1 is forced to 0. This partitions the memory into two sections of equal size, $S_{r0}$ and $S_{r1}$, based on rows.

For example, when ar[i] corresponds to the Most Significant Bit ("MSB") of the row address bus, $S_{r0}$ consists of rows from 0 to (r−1)/2 and $S_{r1}$ consists of rows from (r−1)/2 to r−1. The BIST controller applies the March test from port 1 over $S_{r0}$. In addition, the rest of the row address wires to port 0 are also inverted to provide port 0 with opposite row addresses to port 1. This corresponds to steps 1–6 of the TDM_Test.

When (CS1,CS2,CS3,CS4)=(0,1,0,0), the March test may be applied to port 0 while port 1 is placed in the shadow write and read. The row address ar[i] of port 0 is now forced to 1 while that of port 1 is forced to 0. In this way, the March test may be applied to port 0 over $S_{r1}$. Identical test data may be used for both port 0 and port 1. This corresponds to steps 7–12 of the TDM_Test.

When (CS1,CS2,CS3,CS4)=(0,0,1,0), this corresponds to steps 13–18 of the TDM_Test. In this test session, the bit j of the column address, ac[j], to port 0 is forced to 0 while the bit j of the column address, ac[j], to port 1 is forced to 1, where $0 \leq j \leq c$. This partitions the memory into two sections of equal size, $S_{c0}$ and $S_{c1}$, based on columns, where $S_{c0}$ consists of columns from 0 to (c−1)/2 and $S_{c1}$ consists of columns from (c−1)/2 to c−1. In this test session, the March test may be applied to both ports at the same time, however, with opposite test data and opposite addresses. Port 0 may test $S_{c0}$ and port 1 may test $S_{c1}$. Test responses coming back from $Q_0$ 14 may be inverted since $D_0$ 12 is the inverted version of what the BIST controller provides. In this way, the BIST controller may examine the test responses from both port 0 and port 1 with an identical reference.

Similarly, when (CS1,CS2,CS3,CS4)=(0,0,1,0), the test corresponds to steps 19–24. In this case, the MSB column address to port 0 may be forced to 1 while the MSB column address to port 1 is forced to 0. Similarly, the March test may be applied to both ports with opposite test data and addresses. However, this time, port 0 may test $S_{c1}$ while port 1 tests $S_{c0}$.

In FIG. 8, the shaded area represents the modified memory collar 811. Compared to a conventional memory collar for a 2 port sRAM, which requires all the mux's for both memory ports, the modified collar requires extra r inverters 802, c XOR gates 803, 3 OR gates 804 and 2 mux's 805, where n is the number of bits per word, r and c represent the number of row and column address lines in the memory respectively. In addition, the BIST controller requires an extra of n comparators. As will be shown later, the extra hardware requirements may be further reduced significantly with serialized BIST implementations.

In order to minimize hardware requirements for BIST, a single BIST controller may be shared among a number of memories. However, if these memories are widely dispersed on an AISC, a shared parallel BIST may be expensive due to global routing of the test data bus. This is especially true for wide memories. Serialized memory BIST controllers may minimize this overhead by providing a single bit test input to all the memories and receiving a single bit test responses from each memory, as described in A Serial Interfacing Technique and Built-In Self-Test for Multi-Port RAMs.

The described BIST approach for TDM sRAMs may also be serialized. In addition to savings in routing, the serialization may also reduce the hardware requirement of the BIST controller itself since it is only required to generate a single bit test data to both ports of the TDM sRAM and receives a single bit test result from each port of the TDM sRAM.

The proposed algorithms may easily be extended to work with a serial SMARCH test, as known in the art. The serialization may be accomplished simply by replacing all operations in the proposed algorithms with serial BIST operations as shown in Table 1 below.

TABLE 1

| Parallel BIST operations | Serial BIST operations |
| --- | --- |
| (Wd) | $(W0)^n$ |
| (W$\underline{d}$) | $(W1)^n$ |
| (RdWd) | $(R0W1)^n(R1W1)$ |
| (R$\underline{d}$Wd) | $(R1W0)^n(R0W0)$ |
| (rx) | $(rx)^n$ |
| (wdrx) | $(w0rx)^n(w0rx)$ |
| (w$\underline{d}$rx) | $(w1rx)^n(w1rx)$ |

Figure 9:
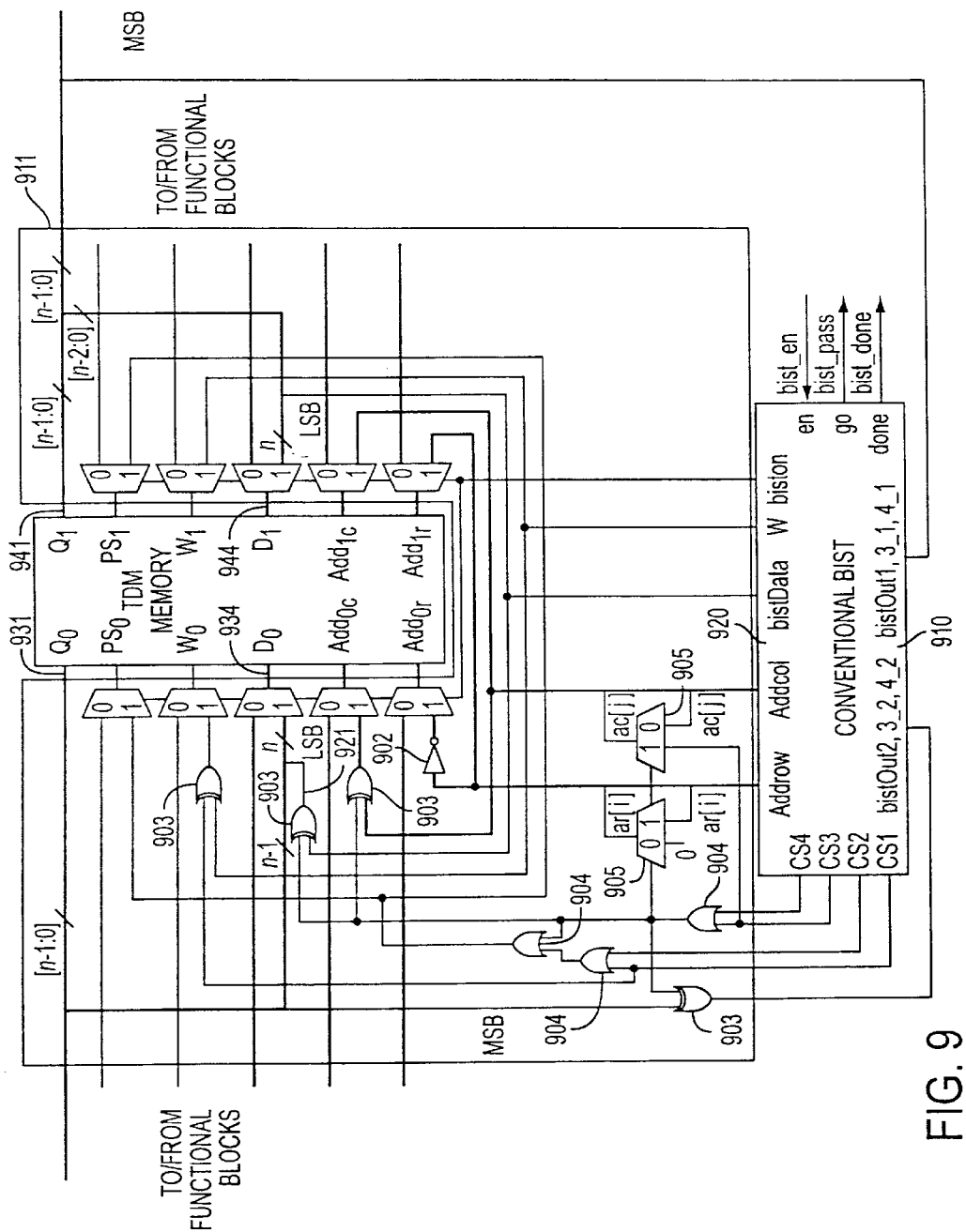
FIG. 9 is a circuit diagram illustrating one embodiment of a BIST suitable for serially testing a plurality of TDM sRAMs in accordance with the method of the present invention.

FIG. 9 is a circuit diagram illustrating one embodiment of a BIST suitable for serially testing a plurality of TDM sRAMs in accordance with the method of the present invention.

FIG. 9 shows an implementation of the serial TDM sRAM BIST for a 2-port TDM sRAM. In FIG. 9, the shaded area represents the BIST collar 911.

As shown in FIG. 9, a single bit test data bistData 920 from the BIST controller is applied to the least significant bit ("LSB") 921 of both data ports 934,944, i.e., $D_0[0]$ and $D_1[0]$. The other n−1 bits of $D_0$ 934 and $D_1$ 944 are fed back from $Q_0$ 931 and $Q_1$ 941 respectively. In other words, $D_0 = \{Q_0[n-2], Q_0[n-3], \ldots, Q_0[1], \text{bistData}\char`\^(C3+C4)\}$ and $D_1 = \{Q_1[n-2], Q_1[n-3], \ldots, Q_1[1], \text{bistData}\}$. The most significant output bit $Q_1[n-1]$ and the inverted $Q_0[n-1]$ are delievered back to the BIST controller 910 for evaluation at bistOut 912. The TDM memory may also include port select inputs $PS_0$ 932 and $PS_1$ 942 receive port selection, through the chip select outputs CS1-4 of BIST controller 910, of the port to be tested.

In terms of hardware costs, in addition to that required in a conventional memory collar, the modified memory collar may require an extra r inverter 902, c XOR gates 903, 3 OR gates 904 and 2 mux's 905. In addition, the BIST controller 910 may require a few extra gates for evaluating two bits of identical test results (i.e., $Q_0[n-1]=Q_1[n-1]$) as opposed to one bit as in the conventional case. In terms of test time, the proposed test requires the same amount of time as to test a single conventional 2-port sRAM of the same size.

As shown in FIG. 8 and FIG. 9, some extra XOR gates 803, 903 and inverters 802,902 may be added to the input signals of port 0 of the TDM memory 801, 901. Although these added gates do not affect functional path timing, they may cause setup timing problems during BIST if the BIST runs at very high frequency. If this happens, one possible solution may be to slightly skew the clocks during BIST such that the clock to the memory is later than that to the BIST.

Another solution may be to move all the added gates except the XOR gate for the write enable to port 1. This is because port 1 has less setup time requirements as compared to port 0 since it uses a later internal clock $f_1$ 8. This change does not affect the coverage of the test algorithm.

Figure 10:
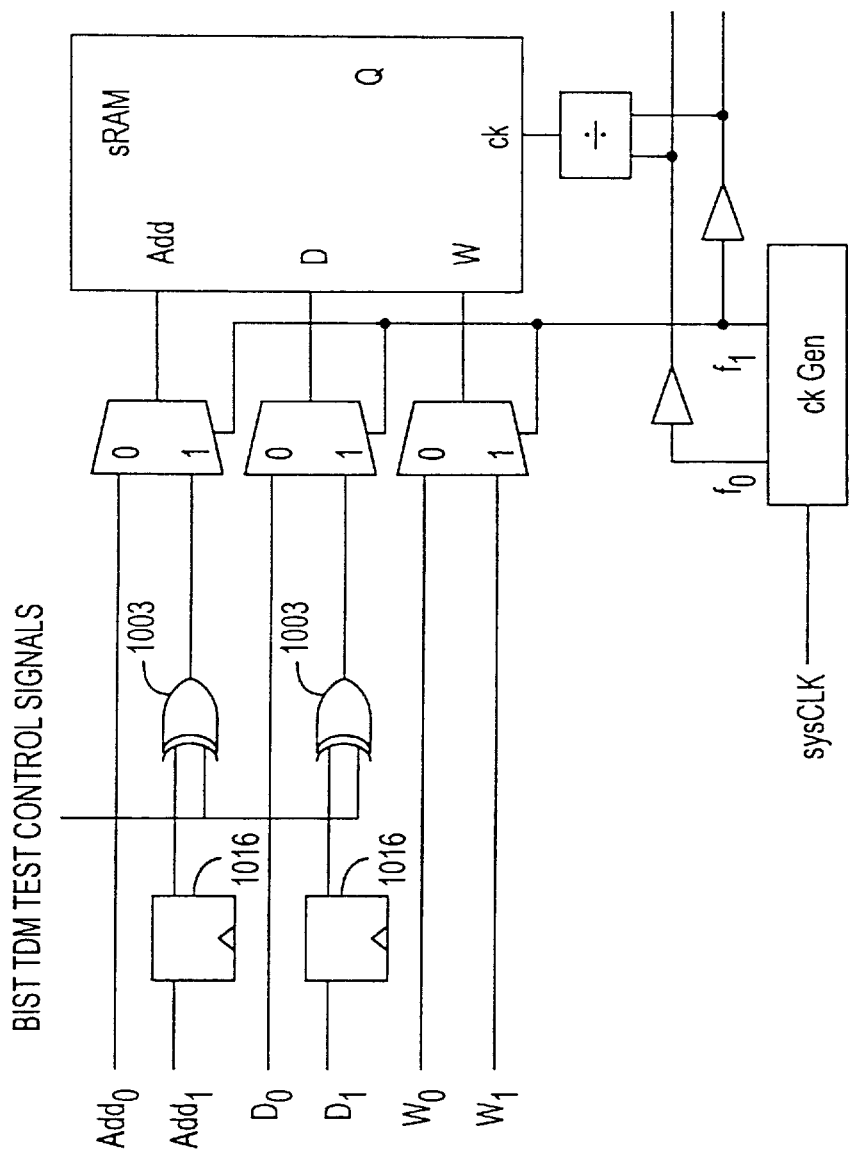
FIG. 10 is a circuit diagram illustrating another embodiment of a TDM sRAM to be tested in accordance with the present invention.

FIG. 10 is a circuit diagram illustrating another embodiment of a TDM sRAM to be tested in accordance with the present invention.

The input signals of port 1 may be registered 1016, which is usually the case, as shown in FIG. 10. If the input signals of port 1 are registered, the added gates 1003, except for the XOR gate to the write enable to port 1, may be moved into the TDM memory 901 and inserted after the registers.

The invention is related in one regard to the use of a computer system for testing TDM sRAMs. According to one embodiment of the invention, the testing of TDM sRAMs is provided via the computer system in response to the processor executing one or more sequences of one or more instructions contained in main memory.

Such instructions may be read into main memory from another computer-readable medium, such as the storage device. Execution of the sequences of instructions contained in main memory causes the processor to perform the process steps described herein. One or more processors in a multi-processing arrangement may also be employed to execute the sequences of instructions contained in main memory. In alternative embodiments, hard wired circuitry may be used in place of or in combination with software instructions to implement the invention. Thus, embodiments of the invention are not limited to specific combination of hardware circuitry and software.

The term "computer-readable medium" as used herein refers to any medium that participates in providing instructions to the processor for execution. Such a medium may take many forms, including but not limited to non-volatile media, volatile media, and transmission media. Non-volatile media include dynamic memory, such as main memory. Transmission media include coaxial cables, copper wire and fiber optics, including the wires that comprise the bus. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EPROM, any other memory chip or cartridge, a carrier wave as described hereinafter, or any other medium from which a computer can read.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for testing a static random access memory having a plurality of ports, the method comprising the step of:

testing a first portion of the memory through a first port with first test values while applying one of a shadow write to and a shadow read from at least one of the others of the plurality of ports, the shadow write writing second test values into portions of the memory not being tested, wherein the second test values are opposite to the first test values, the shadow read reading third test values from the portions of the memory not being tested, wherein the third test values are opposite to the first test values, the number of portions of the memory corresponding to the number of ports of the memory.

2. The method of claim 1 further comprising:

testing a second portion of the memory through the second port with fourth test values through while applying one of the shadow write to and the shadow read from the first portion of the memory through the first port.

3. The method of claim 1 wherein the memory comprises a time domain multiplex static random access memory.

4. The method of claim 1 wherein the step of testing comprises serially testing a plurality of virtual memories.

5. The method of claim 1 wherein the step of testing the memory comprises using a March type test.

6. The method of claim 5 wherein the March type test comprises one of a March-C test and a SMARCH test.

7. A method for testing a static random access memory having a plurality of ports, the method comprising the steps of:

partitioning the memory into n equal sections based on rows, n being the number of ports of the memory and the n row-based sections including at least a first row-based section and a second row-based section;

testing the memory through the first port over the first row-based section while applying a shadow write to the others of the plurality of ports over the others of the n row-based sections;

testing the memory through the second port over the second row-based section while applying a shadow write to the others of the plurality of ports over the others of the n row-based sections;

testing the memory through the first port over the first row-based section while applying a shadow write to the others of the plurality of ports over the others of the n row-based sections; and testing the memory through the first port over the second row-based section while applying a shadow write to the others of the plurality of ports over the others of the n row-based sections.

8. The method of claim 7 further comprising:
partitioning the memory into n equal sections based on columns, the n column-based sections including at least a first column-based section and a second column-based section;
testing the memory through the first port over the first column-based section while applying one of a shadow write to and a shadow read from the others of the plurality of ports over the others of the n row-based sections;
testing the memory through the first port over the second column-based section while applying one of a shadow write to and a shadow read from the others of the plurality of ports over the others of the n row-based sections;
testing the memory through the second port over the first column-based section while applying one of a shadow write to and a shadow read from the others of the plurality of ports over the others of the n row-based sections; and
testing the memory through the second port over the second column-based section while applying one of a shadow write to and a shadow read from the others of the plurality of ports over the others of the n row-based sections.

9. The method of claim 8 wherein the shadow read reads values from memory that are opposite to the values used in testing the memory.

10. The method of claim 8 wherein the method detects at least one of delay faults in both row and column address decoding, time domain multiplex coupling faults on the row and column addresses between the first port and the second port, time domain multiplex coupling faults between a first data input and a second data input, time domain multiplex coupling faults between a first data output and a second data output, and all memory row coupling faults.

11. The method of claim 7 wherein the memory comprises a time domain multiplex static random access memory.

12. The method of claim 7 wherein the step of testing comprises serially testing a plurality of virtual memories.

13. The method of claim 7 wherein testing memory comprises using a MARCH type test.

14. The method of claim 7 wherein each shadow write is followed immediately by reading the opposite value of the shadow write data from the opposite port.

15. The method of claim 7 wherein the method detects at least one of address faults covered by March type tests, memory core cell stuck-at and transition faults, coupling faults across columns, row coupling faults with the first row-based section and the second row-based section, some row coupling faults across the first row-based section and the second row-based section, delay faults on the memory's bit lines, delay faults of the memory's internal clock generator, and delay faults on the memory's read/write enable circuitry in the memory core in for a first and second write enable signal.

16. The method of claim 7 wherein testing the memory comprises one of a March C test and a SMARCH test.

17. The method of claim 7 further comprising:
partitioning the memory into n equal sections based on columns, the n equal sections including at least a first column-based section and a second column-based section;
testing the memory through the first port over the first column-based section while testing the memory through others of the plurality of ports over the others of the n equal column-based sections; and
testing the memory through the second port over the first column-based section while testing the memory through the others of the plurality of ports over the others of the n equal column-based sections.

18. The method of claim 17 wherein the method detects at least one of delay faults in both row and column address decoding, time domain multiplex coupling faults on the row and column addresses between the first port and the second port, time domain multiplex coupling faults between a first data input and a second data input, time domain multiplex coupling faults between a first data output and a second data output, and all memory row coupling faults.

19. A method for testing a static random access memory having a plurality of ports, the method comprising the steps of:
partitioning the memory into n equal sections based on rows, n being the number of ports of the memory and the n row-based sections including at least a first row-based section and a second row-based section;
testing the memory through the second port over the first row-based section while applying a shadow write to the others of the plurality of ports over the others of the n row-based sections;
testing the memory through the first port over the second row-based section while applying a shadow write to the others of the plurality of ports over the others of the n row-based sections.

20. The method of claim 19 further comprising:
partitioning the memory into n equal sections based on columns, the n equal sections including at least a first column-based section and a second column-based section;
testing the memory through the first port over the first column-based section while testing the memory through others of the plurality of ports over the others of the n equal column-based sections; and
testing the memory through the second port over the first column-based section while testing the memory through the others of the plurality of ports over the others of the n equal column-based sections.

21. The method of claim 19 wherein the memory comprises a time domain multiplex static random access memory.

22. The method of claim 19 wherein the step of testing comprises serially testing a plurality of virtual memories.

23. The method of claim 19 wherein testing memory comprises using a MARCH type test.

24. A method for testing a static random access memory having a plurality of ports, the method comprising the steps of:
simulating the memory, which has h rows and $2^c$ columns, to have six virtual memories including a first virtual memory having h/2 rows and $2^c$ columns, a second virtual memory having h/2 rows and $2^c$ columns, a third virtual memory having h rows and $2^{c-1}$ columns, a fourth virtual memory having h rows and $2^{c-1}$ columns, a fifth virtual memory having h rows and $2^{c-1}$ columns, and a sixth virtual memory having h rows and $2^{c-1}$ columns;
testing the first virtual memory with row first addressing;
testing the second virtual memory with row first addressing;
testing the third virtual memory and the fourth virtual memory with column first addressing; and testing the fifth virtual memory and the sixth virtual memory with column first addressing.

25. The method of claim 24 further comprising:
generating four chip select signals CS1, CS2, CS3 and CS4
wherein when (CS1,CS2,CS3,CS4)=(1,0,0,0), the testing of the first virtual memory is performed, when (CS1,CS2,CS3,CS4)=(0,1,0,0), the testing of the second virtual memory is performed, when (CS1,CS2,CS3,CS4)=(0,0,1,0), the testing of the third virtual memory and fourth virtual memory is performed, and when (CS1,CS2,CS3,CS4)=(0,0,0,1), the testing of the fifth virtual memory and sixth virtual memory is performed.

26. The method of claim 24 wherein testing the third virtual memory and the fourth virtual memory comprises testing the third virtual memory and the fourth virtual memory in parallel, and testing the third virtual memory and the fourth virtual memory comprises testing the fifth virtual memory and the sixth virtual memory in parallel.

27. The method of claim 24 wherein testing the third virtual memory and the fourth virtual memory comprises testing the third virtual memory and the fourth virtual memory serially, and testing the third virtual memory and the fourth virtual memory comprises testing the fifth virtual memory and the sixth virtual memory serially.

28. An article of manufacture for testing a static random access memory having a plurality of ports, the article of manufacture comprising:
at least one processor readable carrier; and
instructions carried on the at least one carrier;
wherein the instructions are configured to be readable from the at least one carrier by at least one processor and thereby cause the at least one processor to operate so as to:
testing a first portion of the memory through the first port with first test values while applying one of a shadow write to and a shadow read from the others of the plurality of ports, the shadow write writing second test values into portions of the memory not being tested, wherein the second test values are opposite to the first test values, the shadow read reading third test values from the portions of the memory not being tested, wherein the third test values are opposite to the first test values, the number of portions of the memory corresponding to the number of ports of the memory.

29. A processor readable medium for providing instructions to at least one processor for directing the at least one processor to:
perform a method for testing a static random access memory having a plurality of ports, the method comprising the steps of:
testing a first portion of the memory through the first port with first test values while applying one of a shadow write to and a shadow read from the others of the plurality of ports, the shadow write writing second test values into portions of the memory not being tested, wherein the second test values are opposite to the first test values, the shadow read reading third test values from the portions of the memory not being tested, wherein the third test values are opposite to the first test values, the number of portions of the memory corresponding to the number of ports of the memory.

30. A signal embodied in a carrier wave and representing sequences of instructions which, when executed by at least one processor, cause the at least one processor to perform a method for testing a static random access memory having a plurality of ports, by performing the steps of:
testing a first portion of the memory through the first port with first test values while applying one of a shadow write to and a shadow read from the others of the plurality of ports, the shadow write writing second test values into portions of the memory not being tested, wherein the second test values are opposite to the first test values, the shadow read reading third test values from the portions of the memory not being tested, wherein the third test values are opposite to the first test values, the number of portions of the memory corresponding to the number of ports of the memory.

31. A computer data signal embodied in a carrier wave readable by a computing system and encoding a computer program of instructions for executing a computer process performing the method recited in claim 1.

32. An apparatus for testing a static random access memory, having a plurality of ports, the apparatus comprising:
a first controller testing a first portion of the memory through the first port with first test values while applying one of a shadow write to and a shadow read from the others of the plurality of ports, the shadow write writing second test values into portions of the memory not being tested, wherein the second test values are opposite to the first test values, the shadow read reading third test values from the portions of the memory not being tested, wherein the third test values are opposite to the first test values, the number of portions of the memory corresponding to the number of ports of the memory;
and a second controller testing a second portion of the memory through the second port with fourth test values through while applying one of the shadow write to and the shadow read from the first portion of the memory through the first port.

33. The apparatus of claim 32 wherein the first controller and the second controller are the same.

34. An apparatus for testing a static random access memory, the apparatus comprising:
a testing circuit including a controller, wherein the controller comprises a row address output, a column address output, a first chip select output, a second chip select output, a third chip select output and a fourth chip select output; and
a memory collar including
a first multiplexer coupled to output a signal to a first memory port row address input and receive an input from the controller row address output through an inverter;
a second multiplexer coupled to output a signal to a second memory port row address input and receive an input from the controller row address output;
a third multiplexer coupled to output a signal to a first memory port column address input and receive an input from the controller column address output through a first exclusive-OR gate;
a fourth multiplexer coupled to output a signal to a second memory port column address input and receive an input from the controller column address output;
a fifth multiplexer coupled to output a signal to a first memory port data input and receive an input from a controller data output through a second exclusive-OR gate;

a sixth multiplexer coupled to output a signal to a second memory port data input and receive an input from the controller data output;

a seventh multiplexer coupled to output a signal to a first memory port write enable input and receive an output from a controller write enable output through a third exclusive-OR gate;

an eight multiplexer coupled to output a signal to a second memory port write enable input and receive an output from the controller write enable output;

a ninth multiplexer coupled to receive an output from the controller row address output and to output a signal to the first and the second multiplexers;

a tenth multiplexer coupled to receive an input from the controller column address output and to output a signal to the third and the fourth multiplexers;

a first OR gate coupled to receive a first input from the third chip select and a second input from the fourth chip select and output a signal to the first and the second exclusive-OR gates;

a second OR gate coupled to receive a first input from the first chip select and a second input from the second chip select and output a signal to a third OR gate;

the third OR gate coupled to receive a first input from the first OR gate and a second input from the second OR gate and output a signal to a port select of a first memory port and a port select of a second memory port; and a fourth exclusive-OR gate coupled to receive an input from a first memory port output and output a signal to a controller output evaluator.

* * * * *